(12) United States Patent
Lee et al.

(10) Patent No.: US 9,570,480 B2
(45) Date of Patent: Feb. 14, 2017

(54) LIQUID CRYSTAL DISPLAY AND MANUFACTURING METHOD THEREOF

(71) Applicant: SAMSUNG DISPLAY CO., LTD., Yongin, Gyeonggi-Do (KR)

(72) Inventors: Hee-Keun Lee, Yongin (KR); Yeun Tae Kim, Yongin (KR); Dae Ho Song, Yongin (KR); Hae Ju Yun, Yongin (KR); Soo Jung Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 140 days.

(21) Appl. No.: 14/256,168

(22) Filed: Apr. 18, 2014

(65) Prior Publication Data
US 2015/0015824 A1    Jan. 15, 2015

(30) Foreign Application Priority Data
Jul. 15, 2013  (KR) .......................... 10-2013-0083127

(51) Int. Cl.
*G02F 1/1337*  (2006.01)
*H01L 27/12*  (2006.01)
*G02F 1/1333*  (2006.01)
*G02F 1/1343*  (2006.01)

(52) U.S. Cl.
CPC ..... *H01L 27/1259* (2013.01); *G02F 1/133377* (2013.01); *G02F 2001/134345* (2013.01)

(58) Field of Classification Search
CPC ................. G02F 1/133707; G02F 1/133377; G02F 2001/134345; H01L 27/1259

USPC .................................................. 349/129, 156
See application file for complete search history.

(56) References Cited

U.S. PATENT DOCUMENTS

| | | | |
|---|---|---|---|
| 6,198,217 B1 | 3/2001 | Suzuki et al. | |
| 6,469,761 B1 | 10/2002 | Drabik et al. | |
| 2006/0139529 A1* | 6/2006 | Jeng ................. | G02F 1/133377 349/114 |
| 2010/0014011 A1 | 1/2010 | Mottram et al. | |
| 2014/0111746 A1* | 4/2014 | Kim .................. | G02F 1/133377 349/106 |

FOREIGN PATENT DOCUMENTS

| | | |
|---|---|---|
| JP | 2008-033117 A | 2/2008 |
| JP | 2008-242031 A | 10/2008 |
| KR | 10-0688958 B1 | 2/2007 |
| KR | 10-2008-0049193 A | 6/2008 |
| KR | 10-2012-0026880 A | 3/2012 |

* cited by examiner

*Primary Examiner* — Nathanael R Briggs
*Assistant Examiner* — William Peterson
(74) *Attorney, Agent, or Firm* — Lee & Morse P.C.

(57) ABSTRACT

A liquid crystal display includes a thin film transistor on a substrate, a pixel electrode connected to a first terminal of the thin film transistor, a roof layer above the pixel electrode, a microcavity between the pixel electrode and the roof layer, the microcavity including a liquid crystal injection hole, a partition wall in the microcavity, the partition wall partitioning the microcavity into a first area and a second area, and a liquid crystal layer with liquid crystal molecules in the microcavity, the liquid crystal molecules in the first area being a different type than the liquid crystal molecules in the second area.

19 Claims, 16 Drawing Sheets

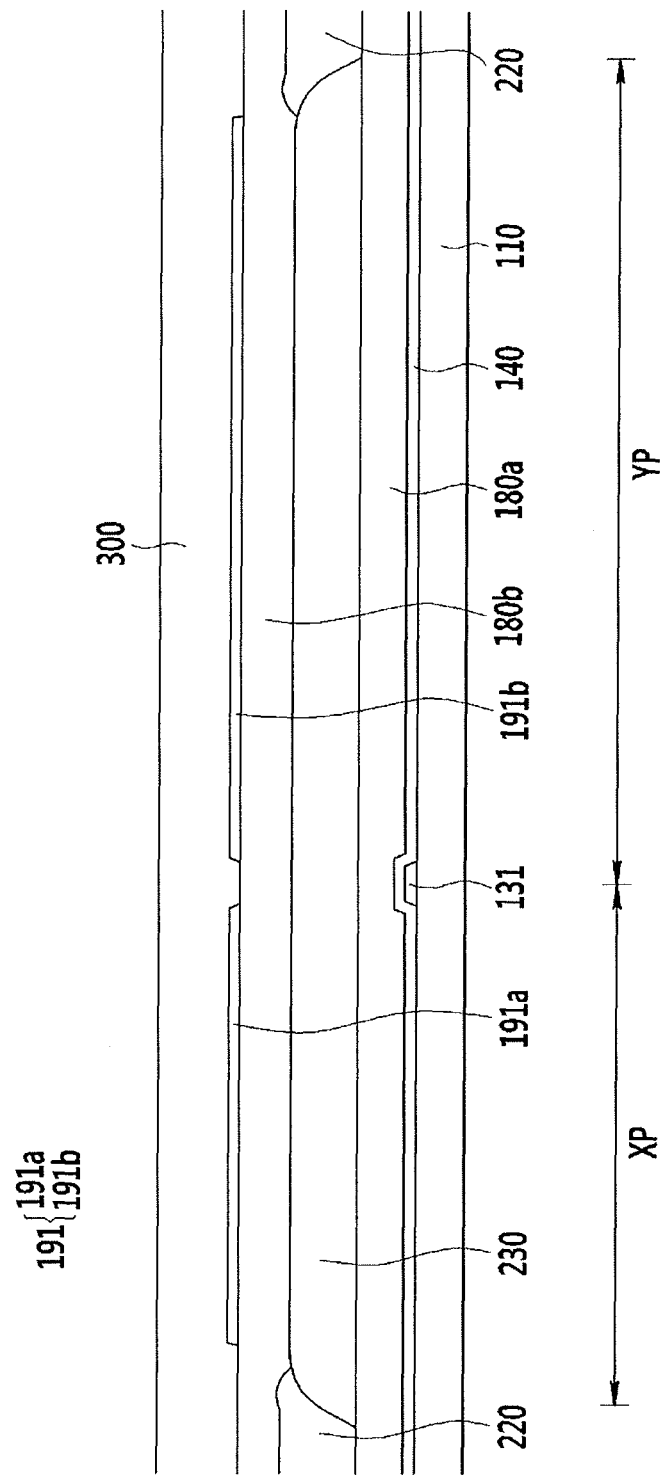

LIQUID CRYSTAL DISPLAY AND MANUFACTURING METHOD THEREOF

CROSS-REFERENCE TO RELATED APPLICATION

Korean Patent Application No. 10-2013-0083127, filed on Jul. 15, 2013, in the Korean Intellectual Property Office, and entitled: "Liquid Crystal Display and Manufacturing Method Thereof," is incorporated by reference herein in its entirety.

BACKGROUND

1. Field

Embodiments relate to a liquid crystal display and a manufacturing method thereof.

2. Description of the Related Art

A liquid crystal display is one of the widely used flat panel displays, and includes two display panels with electric field generating electrodes, e.g., a pixel electrode and a common electrode, and a liquid crystal layer between the two display panels. An image is displayed by applying voltage to the electric field generating electrodes to generate an electric field in the liquid crystal layer, determining orientation of liquid crystal molecules of the liquid crystal layer through the generated electric field, and controlling polarization of incident light.

A liquid crystal display may include a NCD (Nano Crystal Display). A method of manufacturing the NCD includes forming a sacrificial layer with an organic material, forming a support member on an upper part, removing the sacrificial layer to define a microcavity, and filling the microcavity defined by the removal of the sacrificial layer with a liquid crystal.

SUMMARY

An exemplary embodiment provides a liquid crystal display including a thin film transistor on a substrate, a pixel electrode connected to a first terminal of the thin film transistor, a roof layer above the pixel electrode, a microcavity between the pixel electrode and the roof layer, the microcavity including a liquid crystal injection hole, a partition wall in the microcavity, the partition wall partitioning the microcavity into a first area and a second area, and a liquid crystal layer with liquid crystal molecules in the microcavity, the liquid crystal molecules in the first area being a different type than the liquid crystal molecules in the second area.

When an electric field is applied to the liquid crystal layer, degrees of inclination of the liquid crystal molecule in the first area and the second area may be different from each other.

The liquid crystal molecules injected into the first area and the second area may respectively have different dielectric constants.

The liquid crystal display may include a common electrode located between the microcavity and the roof layer.

The liquid crystal display may include an alignment layer located between the microcavity and the common electrode.

The partition wall may include an equal material to a material forming the alignment layer.

A part where the common electrode and the roof layer protrude to a lower end may be located at a part corresponding to the partition wall.

The partition wall may be formed by filling the common electrode and the roof layer.

The liquid crystal display may further include a sustain electrode line located on the substrate, wherein the partition wall is located at a part which overlaps the sustain electrode line.

The pixel electrode may include a first pixel electrode and a second pixel electrode located at the first area and the second area, respectively, and the first pixel electrode and the second pixel electrode may be connected to each other.

The liquid crystal injection hole may include a first liquid crystal injection hole located at the first area and a second liquid crystal injection hole located at the second area, and the first liquid crystal injection hole and the second liquid crystal injection hole may be located at opposite sides based on the partition wall.

Another exemplary embodiment provides a method of manufacturing a liquid crystal display, the method including forming a thin film transistor on a substrate, forming a pixel electrode to be connected with a first terminal of the thin film transistor, forming a sacrificial layer on the pixel electrode, forming a roof layer on the sacrificial layer, removing the sacrificial layer to form a microcavity between the pixel electrode and the roof layer, the microcavity including a liquid crystal injection hole, forming a partition wall in the microcavity, the partition wall partitioning the microcavity into a first area and a second area, injecting a first liquid crystal material into the first area and injecting a second liquid crystal material into the second area, the first liquid crystal material and the second liquid crystal material being different types, and forming a capping layer on the roof layer to cover the liquid crystal injection hole.

Degrees of inclinations of a liquid crystal molecule included in the first liquid crystal material and a liquid crystal molecule included in the second liquid crystal material may be different from each other in the first area and the second area.

The liquid crystal molecules injected into the first area and the second area may respectively have different dielectric constants.

The method may further include forming an open part in a part where the first area and the second area meet by patterning the sacrificial layer, wherein forming the roof layer may include forming the roof layer while filling the open part.

The method may further include forming a lower insulating layer before forming the roof layer, wherein the lower insulating layer may be formed while covering the open part.

The liquid crystal injection hole may include a first liquid crystal injection hole and a second liquid crystal injection hole, the ("first") liquid crystal material may be injected through the first liquid crystal injection hole, and the second liquid crystal material may be injected through the second liquid crystal injection hole.

The first liquid crystal injection hole and the second liquid crystal injection hole may be located at opposite sides based on the partition wall.

The method may further include injecting an alignment material into the microcavity; and drying the alignment material, wherein the partition wall may be formed by remaining solids after the alignment material is dried.

The method may further include forming a recess part at a part where the first area and the second area meet by patterning the sacrificial layer, wherein forming the roof layer may include forming the roof layer while filling the recess part.

BRIEF DESCRIPTION OF THE DRAWINGS

Features will become apparent to those of ordinary skill in the art by describing in detail exemplary embodiments with reference to the attached drawings, in which:

FIGS. 7, 8A-8C, and 9-14 illustrate cross-sectional views of stages in a method of manufacturing a liquid crystal display according to an exemplary embodiment.

DETAILED DESCRIPTION

Figure 1:
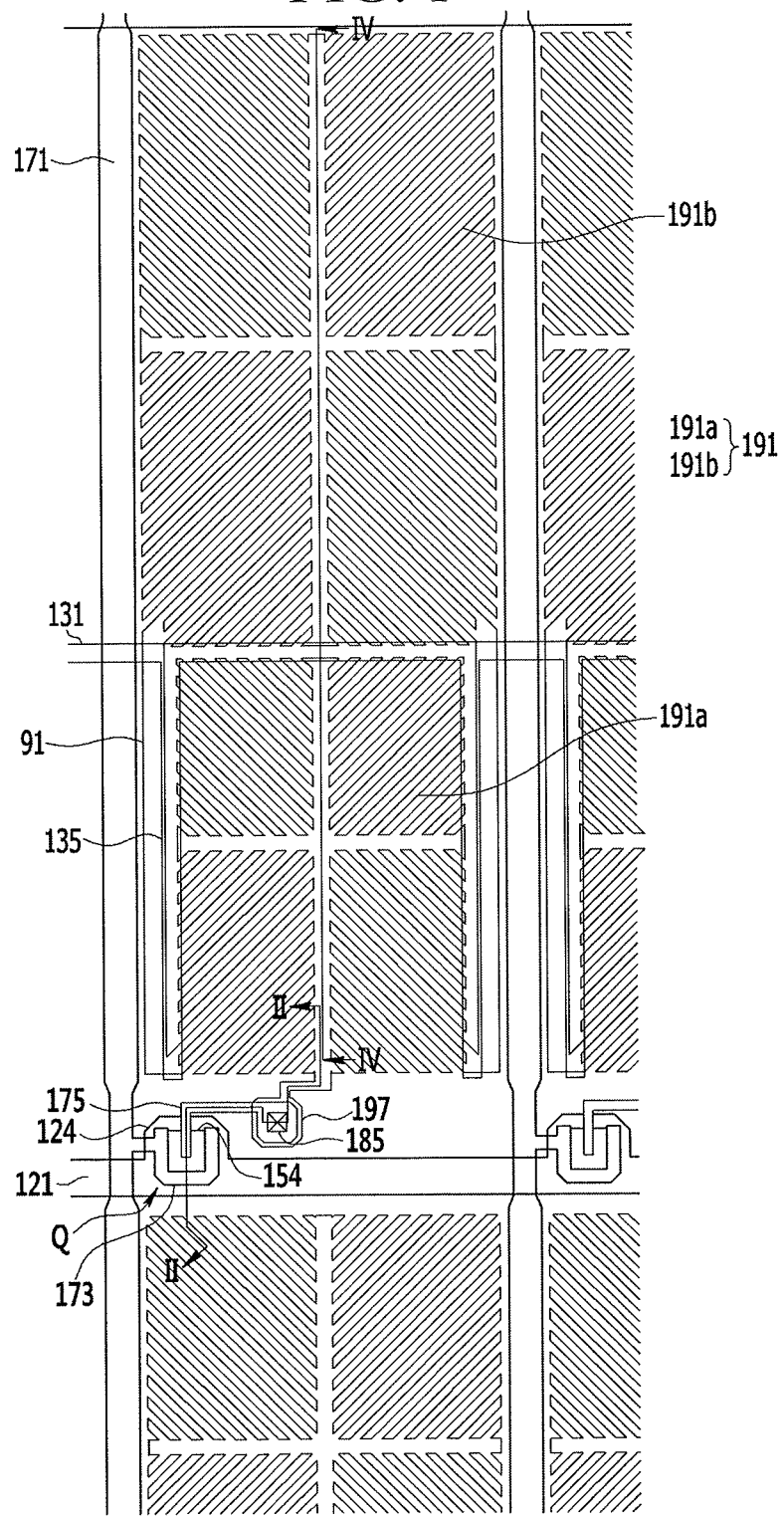
FIG. 1 illustrates a top plan view of a liquid crystal display according to an exemplary embodiment.

Exemplary embodiments will be described in detail below with reference to the accompanying drawings. As those skilled in the art would realize, the described embodiments may be modified in various different ways, all without departing from the spirit or scope of the exemplary implementations. On the contrary, exemplary embodiments introduced herein are provided to make disclosed contents thorough and complete for those skilled in the art.

In the drawings, the thickness of layers, films, panels, regions, etc., may be exaggerated for clarity. It will be understood that when a layer is referred to as being "on" another layer or substrate, it can be directly on the other layer or substrate, or intervening them may also be present. Like reference numerals designate like elements throughout the specification.

Figure 2:
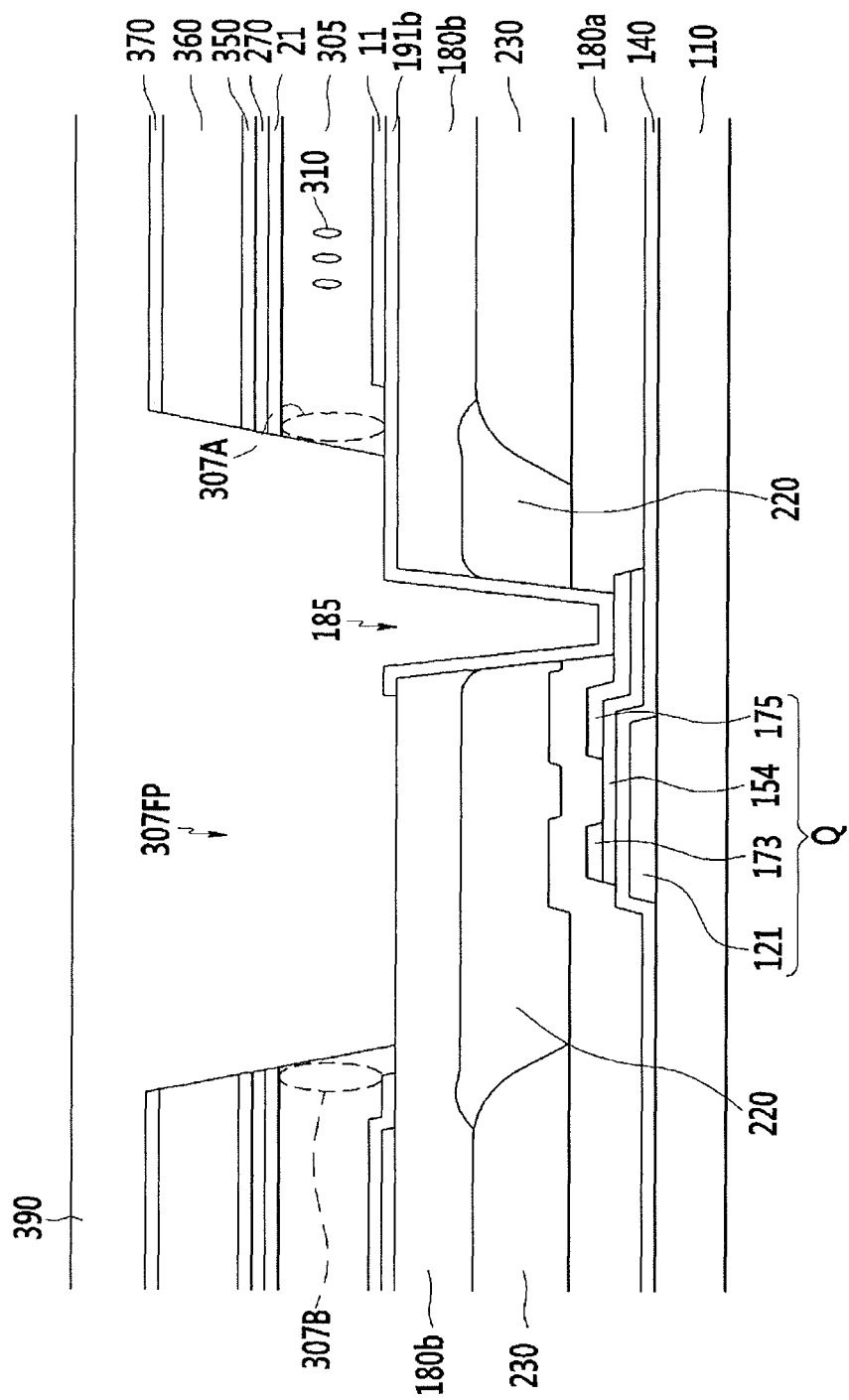
FIG. 2 illustrates a cross-sectional view taken along line II-II of FIG. 1.
Figure 3:
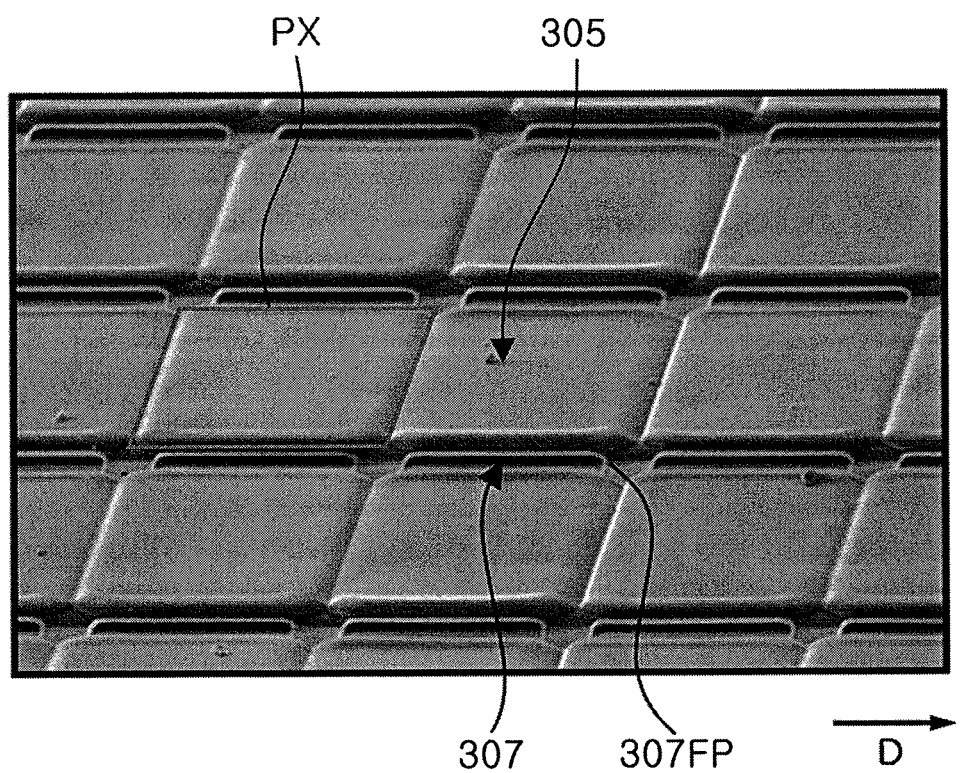
FIG. 3 illustrates a perspective photograph of a microcavity according to an exemplary embodiment.
Figure 4:
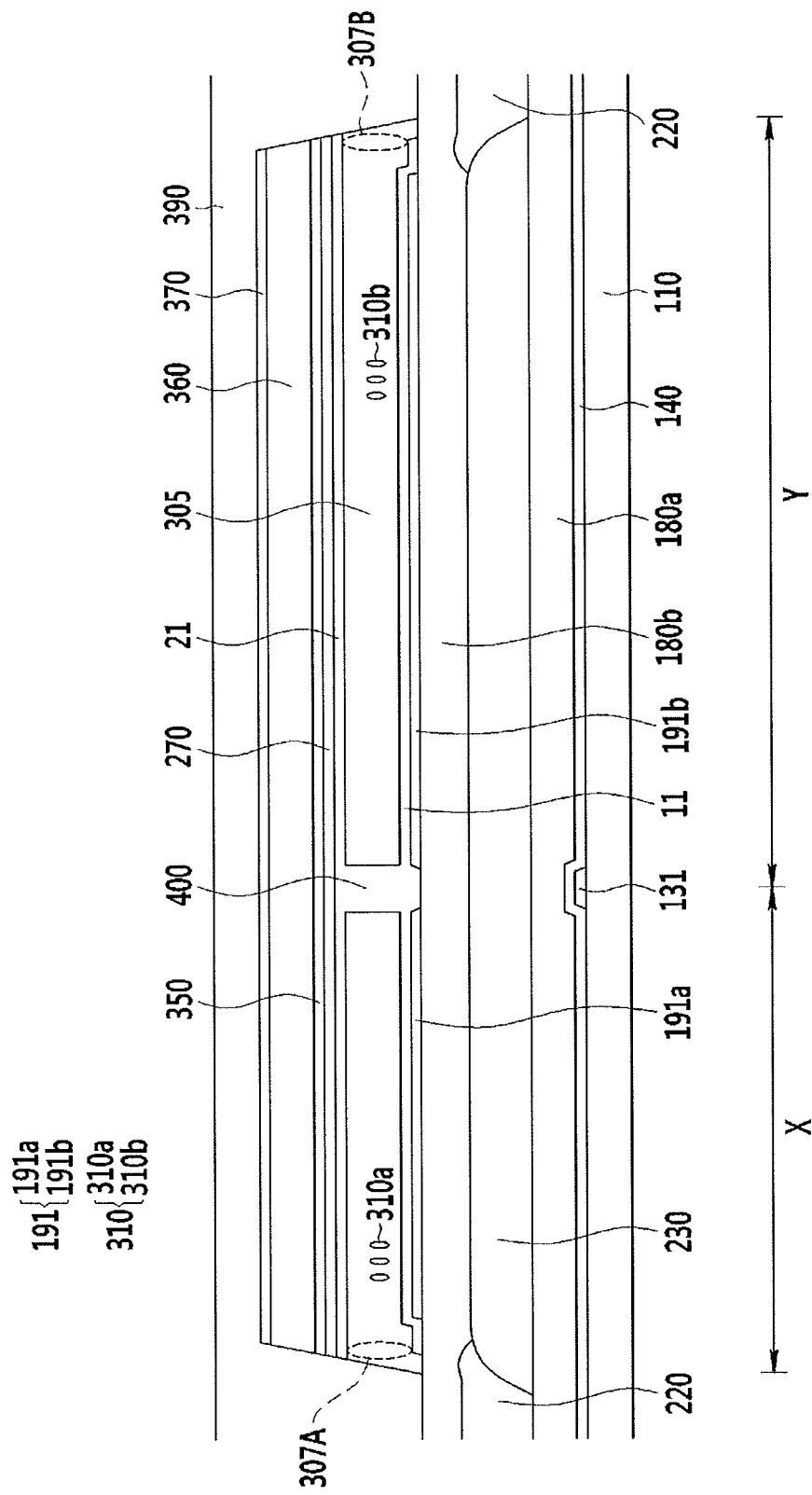
FIG. 4 illustrates a cross-sectional view taken along line IV-IV of FIG. 1.

FIG. 1 illustrates a top plan view of a liquid crystal display according to an exemplary embodiment. FIG. 2 illustrates a cross-sectional view along line II-II of FIG. 1. FIG. 3 illustrates a perspective view of a microcavity according to an exemplary embodiment. FIG. 4 illustrates a cross-sectional view along line IV-IV of FIG. 1.

Referring to FIGS. 1 to 3, a gate line 121 and a sustain electrode line 131 may be located on an insulation substrate 110, e.g., a transparent glass substrate or a plastic substrate. The gate line 121 includes a gate electrode 124. The sustain electrode line 131 extends in a horizontal direction and transmits a predetermined voltage, e.g., a common voltage (Vcom). The sustain electrode line 131 is located substantially in parallel to the gate line 121 and includes a pair of sustain electrode parts 135 extending from a part parallel to the gate line 121 to face each other.

A gate insulating layer 140 may be formed on the gate line 121 and the sustain electrode line 131. A linear semiconductor layer (not shown) located on a lower part of a data line 171, a semiconductor layer 154 located on lower parts, e.g., surfaces, of source/drain electrodes 173/175, and a channel part of a thin film transistor Q may be located on the gate insulating layer 140.

An ohmic contact may be located between the linear semiconductor layer and the data line or the semiconductor layer 154 and the source/drain electrode 173/175, but is omitted in the drawing. Data conductors 171, 173, and 175 including the data line 171, the source electrode 173 connected with the data line 171, and the drain electrode may be formed on the linear semiconductor layer, the semiconductor layer 154, and the gate insulating layer 140. The gate electrode 124, the source electrode 173, and the drain electrode 175 form, e.g., define, the thin film transistor Q together with the semiconductor layer 154, and a channel of the thin film transistor Q is formed on a part of the semiconductor layer 154 between the source electrode 173 and the drain electrode 175.

A first interlayer insulating layer 180a may be formed on the data conductors 171, 173, and 175, and an exposed part of the semiconductor layer 154. The first interlayer insulating layer 180a may include an inorganic insulator or organic insulator, e.g., silicon nitride ($SiN_x$) and silicon oxide ($SiO_x$).

A color filter 230 and a light blocking member 220 may be formed on the first interlayer insulating layer 180a. The light blocking member 220 may be configured in a lattice structure having an opening corresponding to an area displaying an image and formed of a material which light cannot penetrate. The color filter 230 may be formed on the opening of the light blocking member 220. The color filter 230 is located to correspond to the area displaying the image, i.e., in a pixel area.

The color filter 230 may display one of the primary colors, e.g., three primary colors including red, green and blue. However, the colors displayed by the color filter 230 are not limited to the three primary colors including red, green and blue, and the color filter 230 may display one color in the white spectrum, e.g., cyan, magenta, or yellow. The color filter 230 may be formed of a material displaying different colors for each of the adjacent pixels.

A second interlayer insulating layer 180b for covering the color filter 230 and the light blocking member 220 may be formed on the color filter 230 and the light blocking member 220. The second interlayer insulating layer 180b may include an inorganic insulator or an organic insulator, e.g., silicon nitride ($SiN_x$) and silicon oxide ($SiO_x$). Unlike the cross-sectional view illustrated in FIG. 2, when a step is generated due to a difference between thicknesses of the color filter 230 and light blocking member 220, it may be possible to reduce or remove the step by including an organic insulator in the second interlayer insulating layer 180b. A contact hole 185 exposing the drain electrode 175 may be formed through the color filter 230, the light blocking member 220, and the interlayer insulating layers 180a and 180b.

A pixel electrode 191 may be formed on the second interlayer insulating layer 180b. The pixel electrode 191 may be formed of a transparent conductive material, e.g., ITO or IZO. The pixel electrode 191 may include a first pixel electrode 191a and a second pixel electrode 191b. The first pixel electrode 191a and the second pixel electrode 191b have overall shapes of a first quadrangle and a second quadrangle, respectively, and the first quadrangle of the first pixel electrode 191a may be smaller than the second quadrangle of the second pixel electrode 191b.

In detail, referring to FIG. 1, the first pixel electrode 191a and the second pixel electrode 191b may look like they are structurally separated from each other at a part that overlaps the sustain electrode line 131. However, the first pixel electrode 191a and the second pixel electrode 191b are physically and electrically connected to each other through a connection electrode 91.

Each of the first pixel electrode 191a and the second pixel electrode 191b includes a cross branch part including a horizontal branch part and a vertical branch part crossing the horizontal branch part. Further, each of the first pixel electrode 191a and the second pixel electrode 191b is divided into four sub areas by the horizontal branch part and the vertical branch part, and each of the sub areas includes a plurality of fine branch parts. In addition, in the present exemplary embodiment, a peripheral branch part surrounding a peripheral area of the pixel electrode 191 may be further included.

The fine branch part of the pixel electrode 191 may form an angle ranging from about 40 to 45 degrees with the gate line 121. Further, fine branch parts of two adjacent sub areas may be orthogonal to each other. In addition, a width of the fine branch part may gradually become wider, or intervals between the fine branch parts may be different.

The first pixel electrode 191a is physically and electrically connected with the drain electrode 175 through the contact hole 185, and receives a data voltage from the drain electrode 175. Since the first pixel electrode 191a and the second pixel electrode 191b are connected by the connection electrode 91, the first pixel electrode 191a and the second pixel electrode 191b receive the same voltage.

The thin film transistor Q and the pixel electrode 191 are only one example, and a structure of a thin film transistor and a design of a pixel electrode may be changed to improve visibility at a side.

A lower alignment layer 11 is formed on the pixel electrode 191, e.g., the lower alignment layer 11 may be a vertical alignment layer. The lower alignment layer 11 is a liquid crystal alignment layer, e.g., polyamic acid, polysiloxane, or polyimide.

An upper alignment layer 21 is located at a part facing the lower alignment layer 11, and a microcavity 305 is formed between the lower alignment layer 11 and the upper alignment layer 21. A liquid crystal material including a liquid crystal molecule 310 is injected into the microcavity 305 through a liquid crystal injection hole 307. The microcavity 305 may be formed in a column direction of the pixel electrode 191, e.g., in a vertical direction. In the present exemplary embodiment, an alignment material forming the alignment layers 11 and 21 and a liquid crystal material including the liquid crystal molecule 310 may be injected into the microcavity 305 by using capillary force.

Referring to FIG. 3, the microcavity 305 is vertically divided by a plurality of liquid crystal injection hole forming areas 307FP located at parts overlapping the gate line 121, so a plurality of microcavities 305 may be formed in a direction D where the gate line 121 extends. Each of the plurality of formed microcavities 305 may correspond to a pixel area PX, and the pixel area PX may correspond to an area displaying a screen. At this time, the liquid crystal injection hole 307 is formed in a direction where the liquid crystal injection hole forming area 307FP extends. Further, although not illustrated, an interval between microcavities 305 neighboring each other along the direction D, i.e., in a direction parallel to the gate line 121, is covered by a roof layer 360 (FIG. 2).

Referring back to FIG. 2, a common electrode 270 and a lower insulating layer 350 may be located on the upper alignment layer 21. The common electrode 270 receives a common voltage, and generates an electric field together with the pixel electrode 191 receiving a data voltage, so as to determine a direction in which the liquid crystal molecule 310 located at the microcavity 305 between the two electrodes inclines. The common electrode 270 and the pixel electrode 191 define a capacitor to maintain the applied voltage even after the thin film transistor is turned off. The lower insulating layer 350 may be formed of, e.g., silicon nitride ($SiN_x$) or silicon oxide ($SiO_2$).

Although it has been described that the common electrode 270 is formed on the microcavity 305 in the present exemplary embodiment, the common electrode 270 may be formed on a lower part of the microcavity 305 to drive the liquid crystal according to an in-plane switching mode in another exemplary embodiment.

The roof layer 360 is located on the lower insulating layer 350. The roof layer 360 serves to provide support, such that the microcavity 305 corresponding to a space between the pixel electrode 191 and the common electrode 270 can be formed. The roof layer 360 may include photoresist or other organic materials.

An upper insulating layer 370 may be located on the roof layer 360. The upper insulating layer 370 may contact an upper surface of the roof layer 360. The upper insulating layer 370 may be formed of, e.g., silicon nitride ($SiN_x$) or silicon oxide ($SiO_2$).

A capping layer 390 is located on the upper insulating layer 370. In the present exemplary embodiment, the capping layer 390 contact an upper surface and a side surface of the upper insulating layer 370 and also contacts a side surface of the roof layer 360 exposed to the outside. The capping layer 390 covers the liquid crystal injection hole 307 of the microcavity 305 exposed by the liquid crystal injection hole forming area 307FP while filling the liquid crystal injection hole forming area 307FP. The capping layer 390 may be formed of, e.g., a thermosetting resin, silicon oxycarbide (SiOC), or graphene.

An overcoat (not shown) formed of an inorganic layer or an organic layer may be located on the capping layer 390. The overcoat serves to protect the liquid crystal molecule 310 injected into the microcavity 305 from external impact and to planarize a layer, e.g., the capping layer 390.

A polarizer (not shown) is located on a lower part of the insulation substrate 110 and on an upper part of the upper insulating layer 370. The polarizer may include a polarization device generating polarization and a TAC (tri-acetyl-cellulose) layer for securing durability. Directions of transmissive axes of the polarizer, i.e., an upper polarizer and a lower polarizer may, be orthogonal or parallel to each other in some exemplary embodiments.

Referring to FIG. 4, the microcavity 305 corresponds to one pixel area PX, which may include a first area X and a second area Y. The first area X and the second area Y of the pixel area PX are partitioned by a partition wall 400, e.g., the partition wall 400 may completely separate the first and second areas X and Y of the pixel area PX.

The partition wall 400 may include a same material as that forming the alignment layers 11 and 21. For example, the partition wall 400 may be formed by lumpy solid materials left after being dried during formation of the alignment layers 11 and 21. The partition wall 400 may be parallel to the sustain electrode line 131, e.g., perpendicular to the gate line 121. For example, the partition wall 400 may be integral with the alignment layers 11 and 21 to surround, e.g., define, the microcavity 305. For example, the partition wall 400 may define a sidewall of the microcavity 305, e.g., a height of the partition wall 400 may equal a height of the microcavity 305.

The first pixel electrode 191a is positioned in, e.g., to correspond to, the first area X, and a second pixel electrode 191b is positioned in, e.g., to correspond to, the second area Y. As described above, the first pixel electrode 191a and the second pixel electrode 191b are physically and electrically connected by the connection electrode 91.

A first liquid crystal injection hole 307A is formed in the first area X, and a second liquid crystal injection hole 307B is formed in the second area Y. The first liquid crystal injection hole 307A and the second liquid crystal injection hole 307B are located at opposite positions based on the partition wall 400, i.e., on opposite sides of the partition wall 400.

In the present exemplary embodiment, a first liquid crystal molecule 310a is injected into the first area X through the first liquid crystal injection hole 307A, and a second liquid crystal molecule 310b is injected into the second area Y through the second liquid crystal injection hole 307B. The first liquid crystal molecule 310a and the second liquid crystal molecule 310b may have different physical properties. For example, the first liquid crystal molecule 310a and the second liquid crystal molecule 310b may have different dielectric constants. Therefore, a same microcavity 305 corresponding to a single pixel area PX may include liquid crystal molecules of different types, i.e., two types of liquid crystal molecule 310b in two different parts of the same pixel area PX.

Therefore, when voltage is applied to the pixel electrode 191 and the common electrode 270, i.e., when an electric field is formed in the liquid crystal layer, slopes of the first liquid crystal molecule 310a and the second liquid crystal molecule 310b are different from each other, i.e., are not aligned, due to their different physical properties. In contrast, when only one type of liquid crystal molecules is used in the microcavity, formation of an electric field in the liquid crystal layer causes all the liquid crystal molecules to align at a same angle, e.g., after being vertically aligned in response to no electric field in the liquid crystal layer.

Accordingly, since slopes of the first liquid crystal molecule 310a and the second liquid crystal molecule 310b in respective first and second areas X and Y are different from each other, the voltage-transmittance curve lines in the first and second areas X and Y of the same pixel area PDX are different from each other. As such, a luminance value varies while the pixel area part corresponding to the first area X and the pixel area part corresponding to the second area Y have different voltage-transmittance curve lines (in spite of being in a same pixel area), thereby improving display, e.g., visibility, properties.

Further, in the present exemplary embodiment, there is one thin film transistor connected to one pixel area. Nevertheless, the visibility can be improved by injecting different liquid crystal materials into the first area X and the second area Y partitioned by the partition wall 400, so that a structure of the thin film transistor may be simplified.

Figure 5:
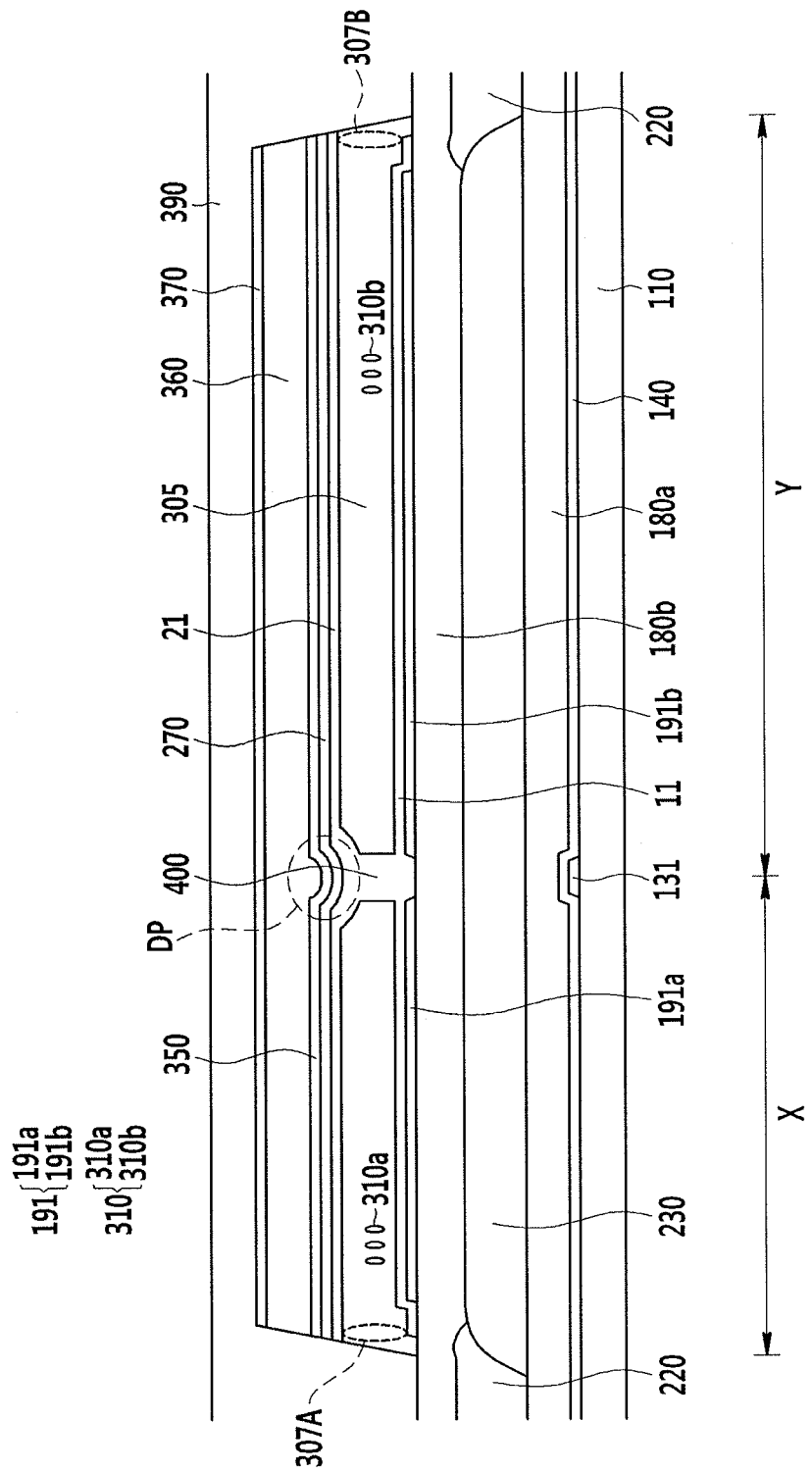
FIG. 5 illustrates a cross-sectional view of a liquid crystal display according to an exemplary embodiment.

FIG. 5 illustrates a cross-sectional view of a liquid crystal display according to another exemplary embodiment.

Referring to FIG. 5, a liquid crystal display according to another exemplary embodiment may be substantially the same as that described previously with reference to FIGS. 1-4, with the exception of having a height of a partition wall 400' to be smaller than a height of the microcavity 305. That is, an upper part DP of the partition wall 400' may be dented downwardly, and the upper part DP may be covered by the common electrode 270, the lower insulating layer 350, and the roof layer 360.

Figure 6:
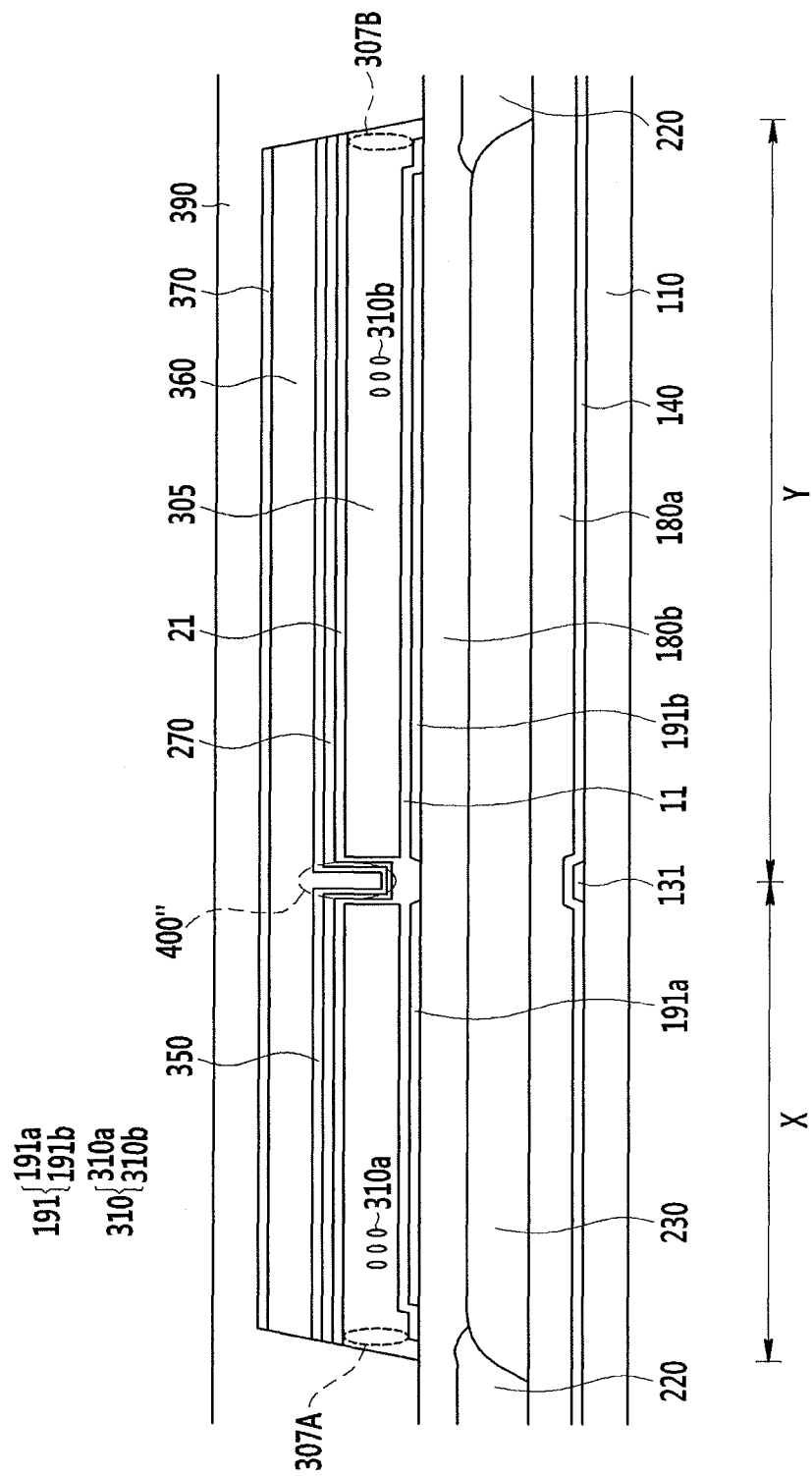
FIG. 6 illustrates a cross-sectional view of a liquid crystal display according to an exemplary embodiment.

FIG. 6 illustrates a cross-sectional view of a liquid crystal display according to another exemplary embodiment.

Referring to FIG. 6, a liquid crystal display according to another exemplary embodiment may be substantially the same as that described previously with reference to FIGS. 1-4, with the exception of having an empty space between the first area X and the second area Y to define a partition wall 400''. Further, the common electrode 270, the lower insulating layer 350, and the roof layer 360 may be conformally formed to cover the empty space. The dried solids forming the alignment layers 11 and 21 may remain around the partition wall 400, but the lumpy degree described in FIGS. 4 and 5 is very low or there may be no remaining solids.

FIGS. 7 to 14 illustrate cross-sectional views of stages in a manufacturing method of a liquid crystal display according to an exemplary embodiment. FIGS. 7 to 14 illustrate a process order according to a cross-sectional view taken along line IV-IV of FIG. 1.

Figure 7:
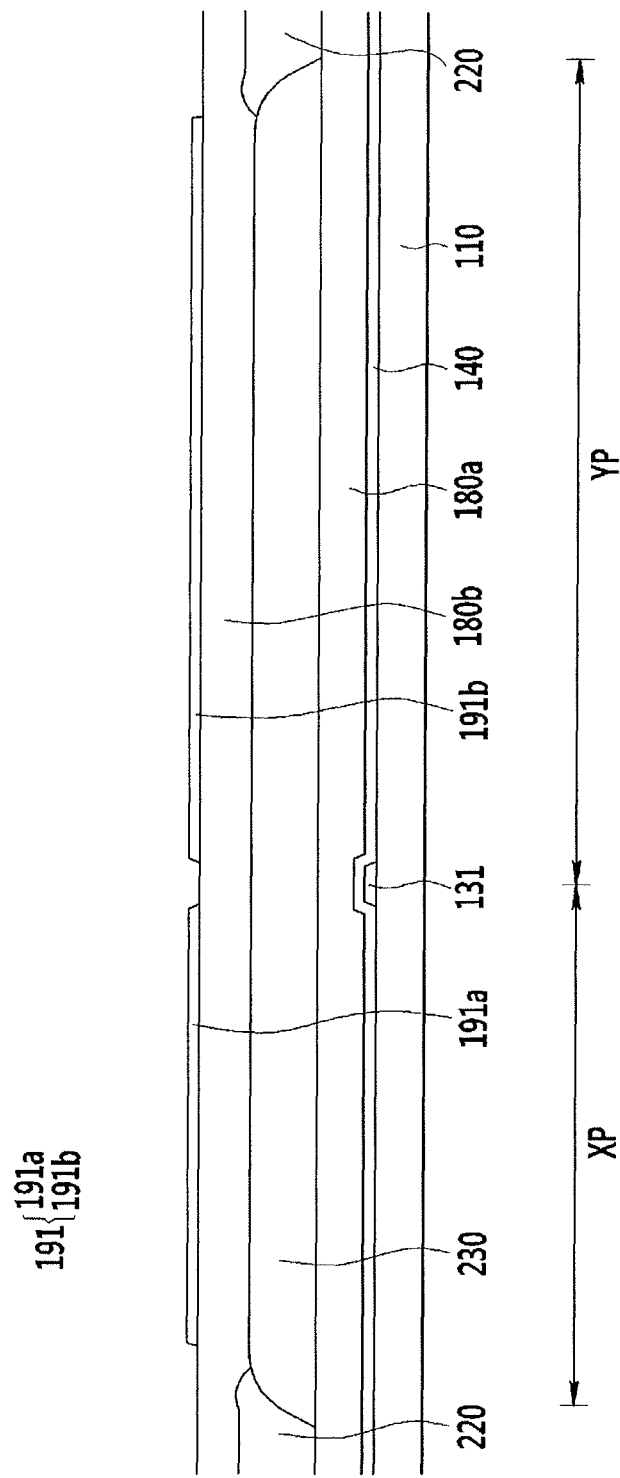

Referring to FIG. 7, the sustain electrode line 131 extending in parallel to the thin film transistor and the gate line may be formed on the substrate 110. The first interlayer insulating layer 180a may be formed to cover the thin film transistor. The color filter 230 and the light blocking member 220 may be foamed on the first interlayer insulating layer 180a, and the second interlayer insulating layer 180b may be formed on the color filter 230 and the light blocking member 220. The pixel electrode 191 may be formed on the second interlayer insulating layer 180b. The pixel electrode 191 may be formed to include the first pixel electrode 191a corresponding to a first reserve area XP and the second pixel electrode 191b corresponding to a second reserve area YP.

Figure 8B:
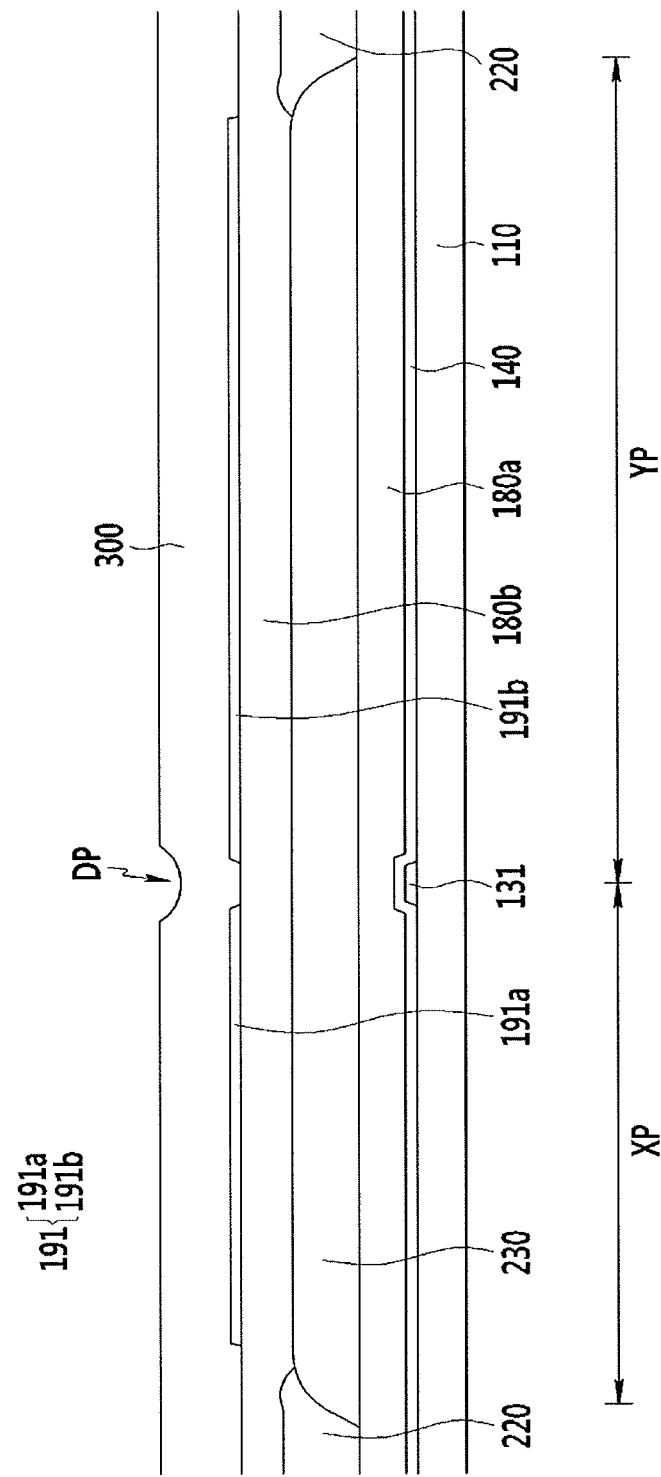
Figure 8C:
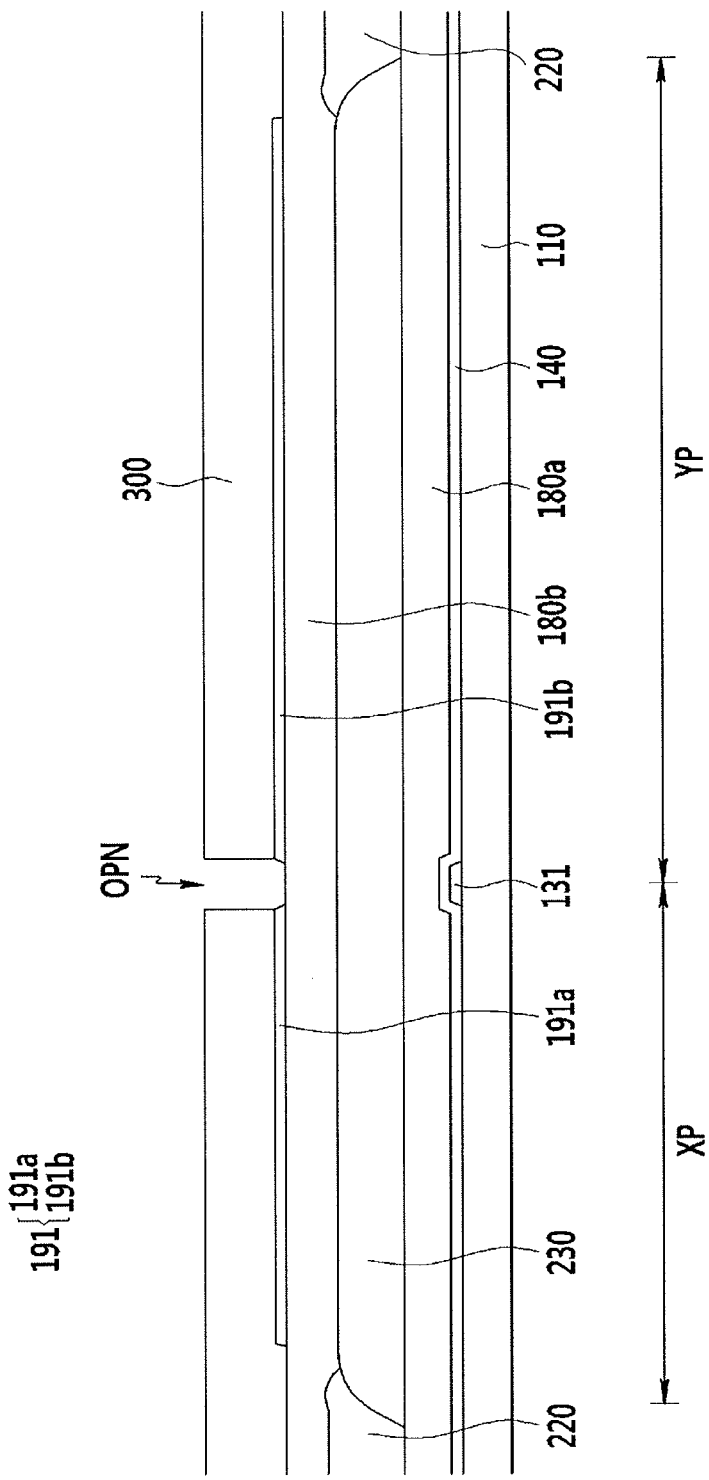

FIGS. 8A, 8B, and 8C illustrate various exemplary embodiments of forming the sacrificial layer 300, respectively.

Referring to FIG. 8A, the sacrificial layer 300 may be formed on the pixel electrode 191, e.g., to have a flat top surface. In the present exemplary embodiment, the sacrificial layer 300 may be formed to cover the first pixel electrode 191a, the second pixel electrode 191b, and a gap between the first pixel electrode 191a and the second pixel electrode 191b in one pixel area.

Referring to FIG. 8B, according to another exemplary embodiment, a dented part DP may be formed in the sacrificial layer 300, after formation of the sacrificial layer 300 on the pixel electrode 191, by patterning the sacrificial layer 300. The dented part DP may be formed in a direction in which the sustain electrode line 131 extends. The dented part DP may be formed by using a slit mask or controlling an exposure amount.

Referring to FIG. 8C, according to another exemplary embodiment, an open part OPN may be formed in the sacrificial layer 300, after formation of the sacrificial layer 300 on the pixel electrode 191, by patterning the sacrificial layer 300. The open part OPN may be formed in a direction in which the sustain electrode line 131 extends. The open part OPN may leave a part of the sacrificial layer 300 at a lower end of the open part OPN in order not to expose the second interlayer insulating layer 180b or the pixel electrode 191.

FIGS. 9 to 12 illustrate the following process according to an exemplary embodiment described in FIG. 8A.

Figure 9:
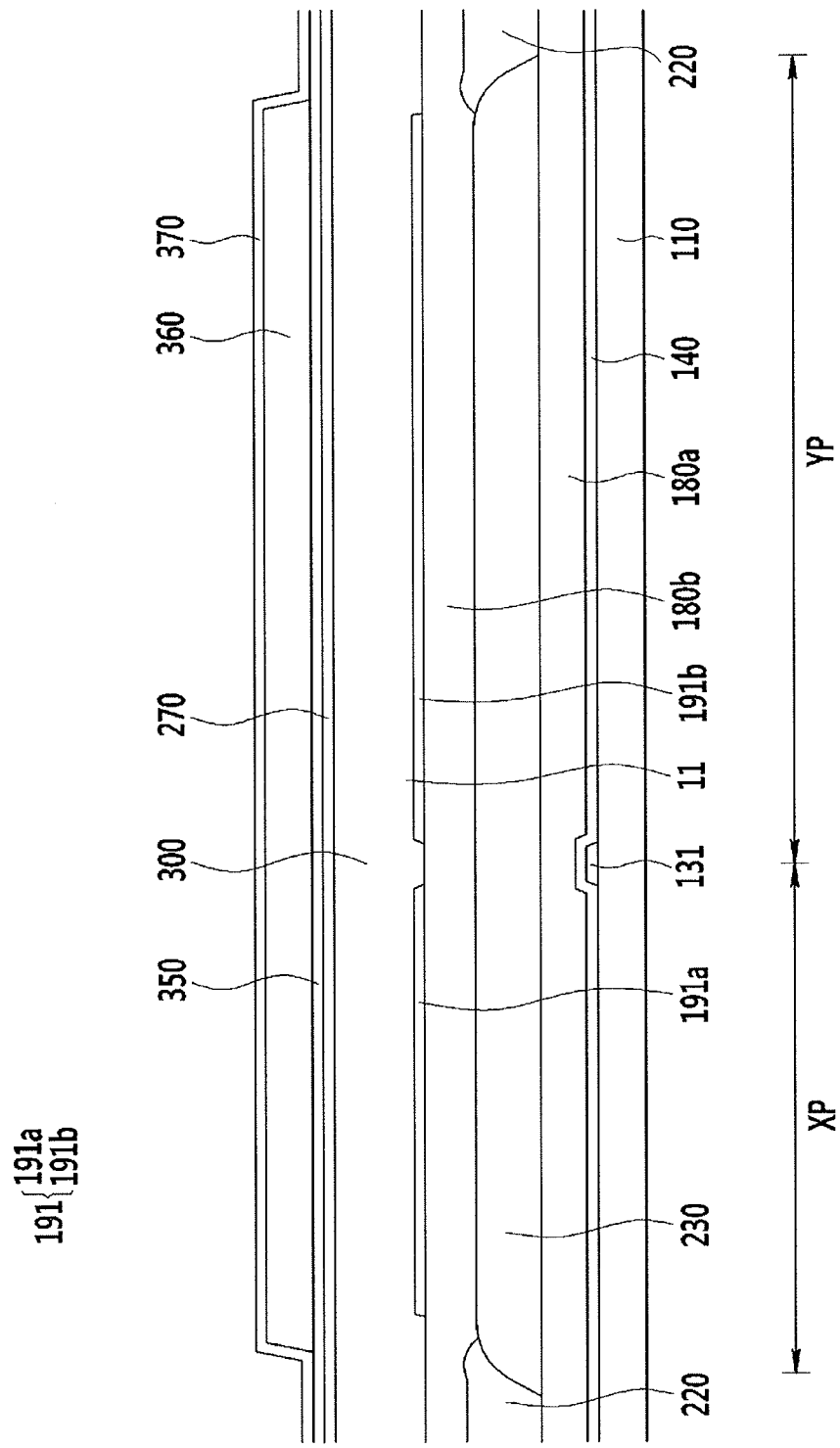

Referring to FIG. 9, the common electrode 270, the lower insulating layer 350, and the roof layer 360 may be sequentially formed on the sacrificial layer 300. The roof layer 360 may be located between the pixel areas neighboring in a vertical direction by exposure and development processes and may be removed from an area corresponding to the light blocking member 220. The roof layer 360 exposes the lower insulating layer 350 to the outside in the area corresponding to the light blocking member 220. The upper insulating layer 370 may be formed to cover the roof layer 360 and the exposed lower insulating layer 350.

Figure 10:
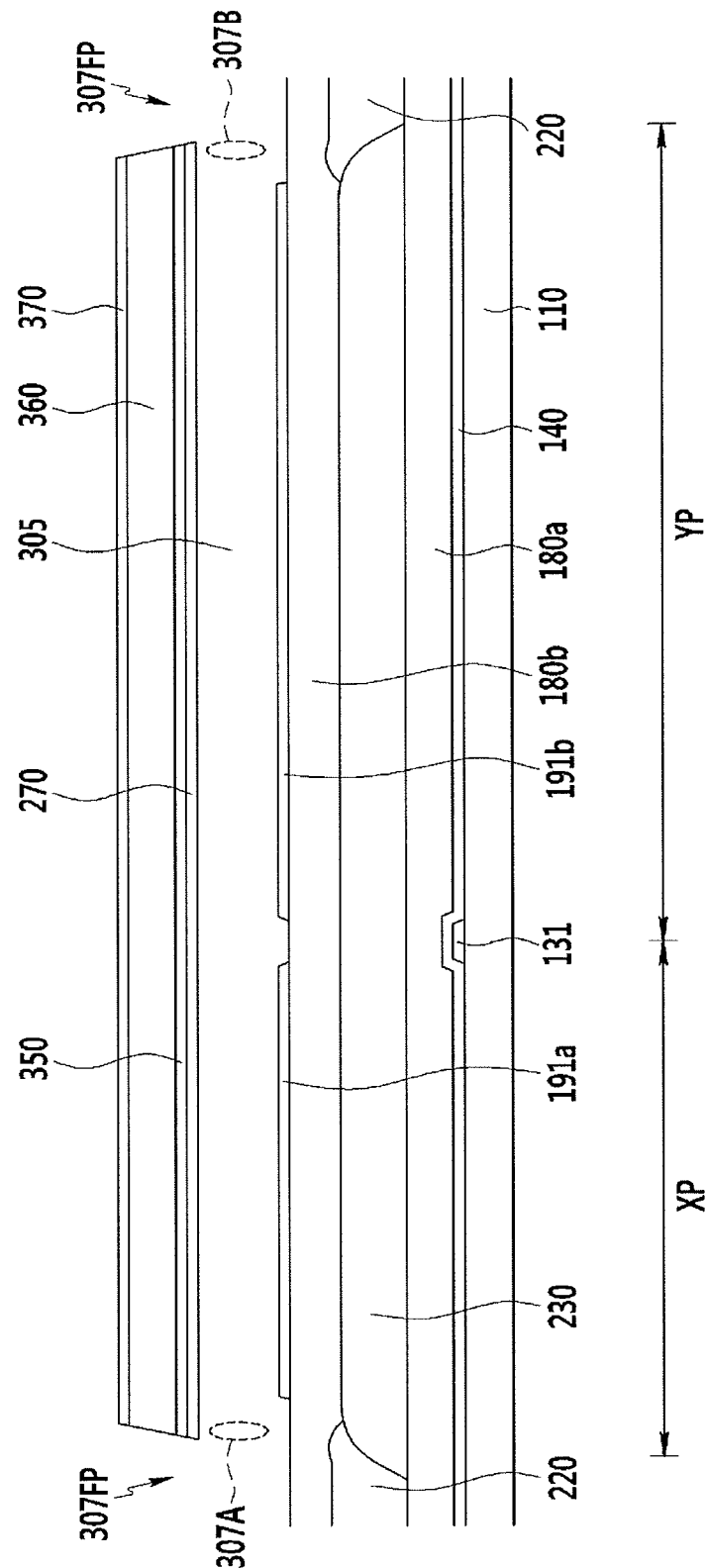

Referring to FIG. 10, the upper insulating layer 370, the lower insulating layer 350, and the common electrode 270 may be etched by an etching mask. The liquid crystal injection hole forming area 307FP may be formed by partially removing the upper insulating layer 370, the lower insulating layer 350, and the common electrode 270. Next, the sacrificial layer 300 may be removed by O₂ ashing processing or a wet etching method through the formed liquid crystal injection hole forming area 307FP. At this time, the microcavity 305 having the liquid crystal injection holes 307A and 307B at both edges is formed. That is, the removal of the sacrificial layer 300 defines an empty space between the common electrode 270 and the pixel electrode 191, so the microcavity 305 is defined in the empty space.

Figure 11:
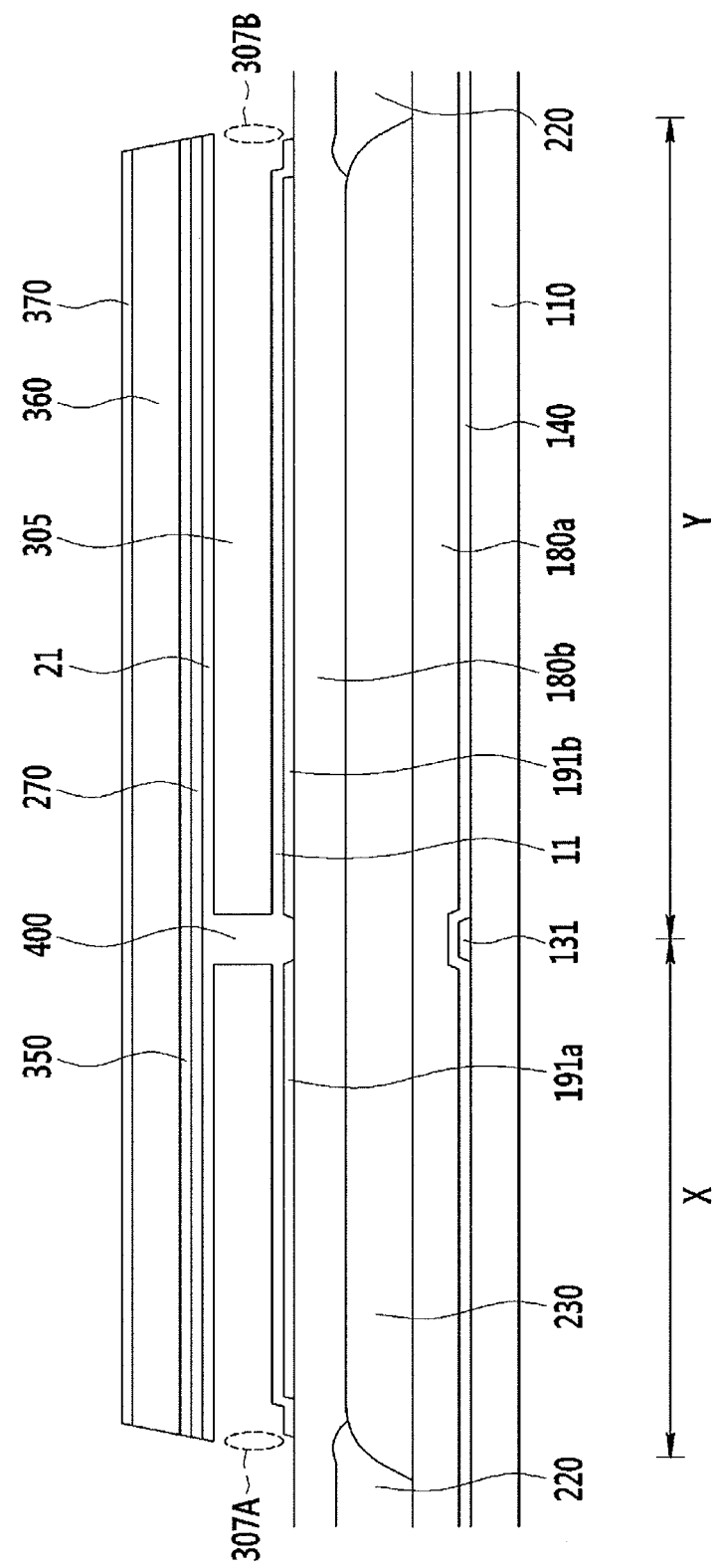

Referring to FIG. 11, the alignment layers 11 and 21 are formed on the pixel electrode 191 and the common electrode 270 by injecting an alignment material through the liquid crystal injection hole 307. For example, a bake process is performed after the alignment material, including solids and a solvent, is injected through the liquid crystal injection hole 307. Next, both the liquid crystal injection holes 307A and 307B simultaneously are dried, and thus the solids become lumpy within the microcavity 305. That is, the solids are the remaining components in the microcavity 305, after the solvent of the alignment material evaporates, thereby forming the partition wall 400 within the microcavity 305. The partition wall 400 partitions the microcavity 305 into the first area X and the second area Y.

Figure 12:
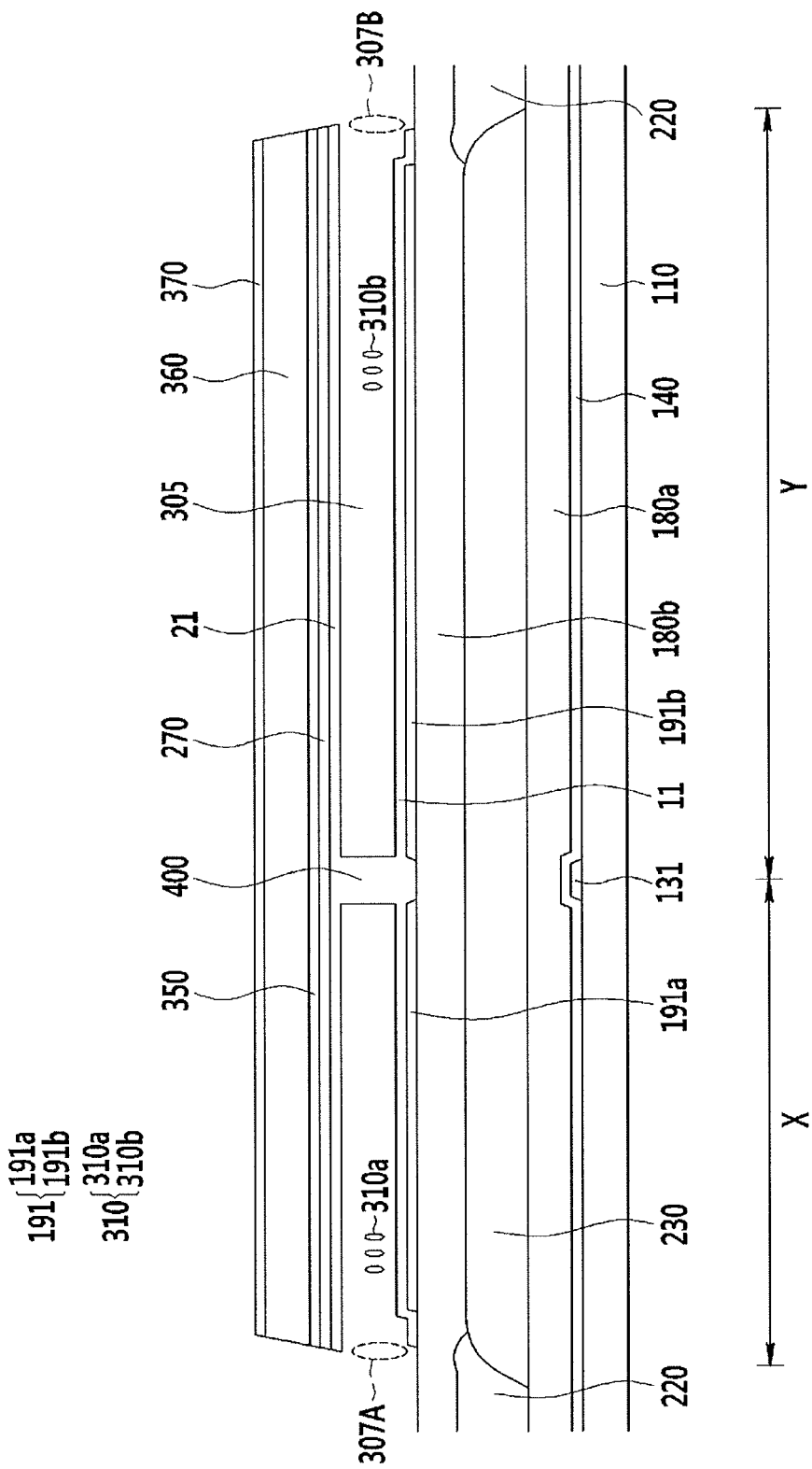

Referring to FIG. 12, a first liquid crystal material including the first liquid crystal molecule 310a is injected through the first liquid crystal injection hole 307A, and a second liquid crystal material including the second liquid crystal molecule 310b is injected through the second liquid crystal injection hole 307B. Thereafter, the capping layer is formed on the upper insulating layer 370 to cover the liquid crystal injection holes 307A and 307B, so the liquid crystal display illustrated in FIG. 4 is formed.

Hereinafter, the following process according to an exemplary embodiment described in FIGS. 8B and 8C will be described.

The components of the exemplary embodiment described in FIG. 8B are formed through almost the same method used in the exemplary embodiment described FIG. 8A. However, since the dented part DP is formed in the step described in FIG. 8B, the components on the sacrificial layer 300 are formed to fill the dented part DP in the step of forming the common electrode 270, the lower insulating layer 350, and the roof layer 360. Further, since a height of a part where the dented part DP is formed is lower than heights of both the liquid crystal injection holes 307A and 307B, the capillary force increases, thereby causing the solids to become lumpy, e.g., aggregate, in the dented part DP to form the partition wall 400'. In general, the capillary force within a structurally narrow space has a large effect.

The following process according to the exemplary embodiment described in FIG. 8C will be described with reference to FIGS. 13 and 14.

Figure 13:
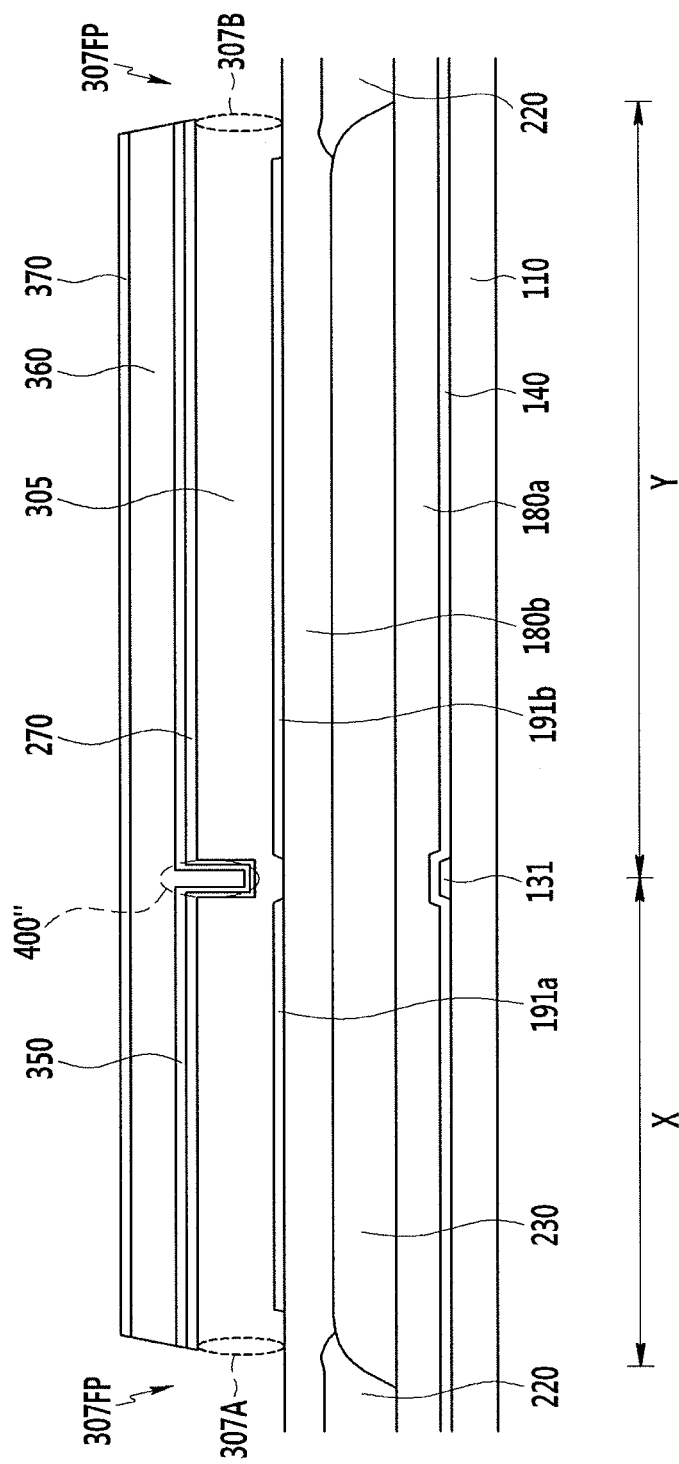

Referring to FIG. 13, the common electrode 270, the lower insulating layer 350, and the roof layer 360 are formed while filling the open part OPN on the sacrificial layer 300 after the step of FIG. 8C. Thereafter, the liquid crystal injection hole forming region 307FP is formed through the same patterning method described in FIGS. 9 and 10. The sacrificial layer 300 is removed by O₂ ashing processing or a wet etching method through the formed liquid crystal injection hole forming area 307FP. At this time, the microcavity 305 having the liquid crystal injection holes 307A and 307B is formed at both edges. In the present exemplary embodiment, since the partition wall 400" has been already formed, the first area X and the second area Y are formed in the present step. The first area X has a closed structure in which the first liquid crystal injection hole 307A is formed at one edge of the first area X and the partition wall 400 is formed at the other edge. The second area Y has a closed structure in which the second liquid crystal injection hole 307B is formed at one edge of the second area Y and the partition wall 400 is formed at the other edge.

Figure 14:
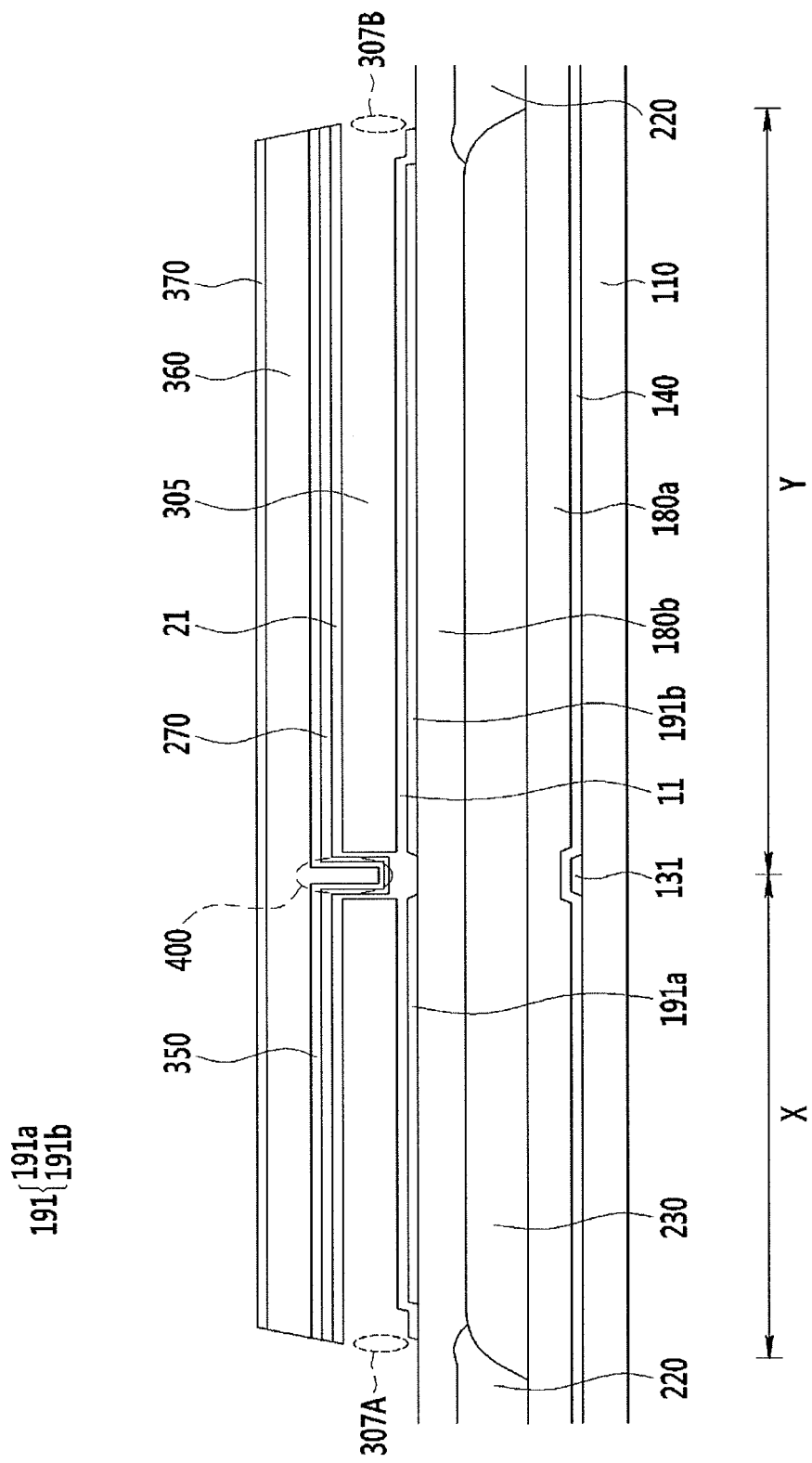

Referring to FIG. 14, the alignment layers 11 and 21 are formed on the pixel electrode 191 and the common electrode 270 by injecting an alignment material through each of the liquid crystal injection holes 307A and 307B. For example, a bake process is performed after the alignment material, including solids and a solvent, is injected through the liquid crystal injection hole 307. At this time, since the first area X and the second area Y have a structure in which one edge of the first area X and the second area Y is partitioned with the partition wall 400, unlike the exemplary embodiment described in FIGS. 8A and 8B, a phenomenon in which the solids lumps within the first area X and the second area Y is not generated.

In addition to the aforementioned differences, the description of the following process of the exemplary embodiment described in FIG. 8A or 8B may be equally applied to the following process of the exemplary embodiment described in FIG. 8C.

By way of summary and review, a conventional method of manufacturing a liquid crystal display, e.g., a NCD, includes a process of injecting and then drying an alignment liquid, before injecting liquid crystal molecules into a microcavity. During the process of drying the alignment liquid, solids of the alignment liquid agglomerate into scattered lumps, thereby causing light leakage and/or transmittance deterioration.

In contrast, according to example embodiments, a liquid crystal display may include a partition wall formed of the solid/lumpy alignment material, thereby preventing or substantially minimizing scattering of solid/lumpy alignment material in the microcavity. Further, display characteristics, e.g., visibility, maybe improved by injecting different types of liquid crystal materials into respective areas partitioned by the partition wall.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A liquid crystal display, comprising:
a thin film transistor on a substrate;
a pixel electrode connected to a first terminal of the thin film transistor;
a roof layer above the pixel electrode;
a microcavity between the pixel electrode and the roof layer, the microcavity including a liquid crystal injection hole;
a first alignment layer on the pixel electrode;

a partition wall in the microcavity, the partition wall partitioning the microcavity into a first area and a second area; and a liquid crystal layer with liquid crystal molecules in the microcavity, the liquid crystal molecules in the first area being a different type than the liquid crystal molecules in the second area, wherein the partition wall includes a same material as the first alignment layer.

2. The liquid crystal display as claimed in claim 1, wherein, when an electric field is applied to the liquid crystal layer, inclination degrees of the liquid crystal molecules in the first area and the second area are different from each other.

3. The liquid crystal display as claimed in claim 2, wherein the liquid crystal molecules in the first area have a different dielectric constant than the liquid crystal molecules in the second area.

4. The liquid crystal display as claimed in claim 1, wherein the first alignment layer is between the microcavity and the pixel electrode, the first alignment layer being in direct contact with an entire upper surface of the pixel electrode.

5. The liquid crystal display as claimed in claim 1, further comprising:

a common electrode disposed between the microcavity and the roof layer; and a second alignment layer disposed between the microcavity and the common electrode.

6. The liquid crystal display as claimed in claim 5, wherein the partition wall has a lower height than the microcavity, respective parts of the common electrode and of the roof layer being bent toward the partition wall.

7. The liquid crystal display as claimed in claim 5, wherein the microcavity includes an opening, respective parts of the common electrode and of the roof layer filling the opening to define the partition wall.

8. The liquid crystal display as claimed in claim 1, further comprising a storage electrode line on the substrate, the partition wall overlapping the storage electrode line.

9. The liquid crystal display as claimed in claim 1, wherein the pixel electrode includes a first pixel electrode and a second pixel electrode disposed at the first area and the second area, respectively, the first pixel electrode and the second pixel electrode being connected to each other.

10. The liquid crystal display as claimed in claim 1, wherein the liquid crystal injection hole includes a first liquid crystal injection hole disposed at the first area and a second liquid crystal injection hole disposed at the second area, the first liquid crystal injection hole and the second liquid crystal injection hole being at opposite sides of the partition wall.

11. A method of manufacturing a liquid crystal display, the method comprising:

forming a thin film transistor on a substrate;

forming a pixel electrode to be connected with a first terminal of the thin film transistor;

forming a first alignment layer on the pixel electrode;

forming a sacrificial layer on the first alignment layer;

forming a roof layer on the sacrificial layer;

removing the sacrificial layer to form a microcavity between the first alignment layer and the roof layer, the microcavity including a liquid crystal injection hole;

forming a partition wall in the microcavity, the partition wall including a same material as the first alignment layer and partitioning the microcavity into a first area and a second area;

injecting a first liquid crystal material into the first area and injecting a second liquid crystal material into the second area, the first liquid crystal material and the second liquid crystal material being different types; and forming a capping layer on the roof layer to cover the liquid crystal injection hole.

12. The method as claimed in claim 11, wherein, when an electric field is applied to the first and second liquid crystal material, inclination degrees of liquid crystal molecules in the first liquid crystal material and liquid crystal molecules in the second liquid crystal material are different from each other.

13. The method as claimed in claim 12, wherein the liquid crystal molecules injected into the first area and the second area have respectively different dielectric constants.

14. The method as claimed in claim 11, further comprising patterning the sacrificial layer to form an open part between the first area and the second area, the roof layer extending into the open part to fill the open part.

15. The method as claimed in claim 14, further comprising forming a lower insulating layer, before forming the roof layer, such that the lower insulating layer extends into the open part.

16. The method as claimed in claim 11, wherein the liquid crystal injection hole includes a first liquid crystal injection hole and a second liquid crystal injection hole, the first liquid crystal material being injected through the first liquid crystal injection hole, and the second liquid crystal material being injected through the second liquid crystal injection hole.

17. The method as claimed in claim 16, wherein the first liquid crystal injection hole and the second liquid crystal injection hole are disposed at opposite sides of the partition wall.

18. The method as claimed in claim 11, further comprising:

injecting an alignment material into the microcavity; and drying the alignment material, such that the partition wall is formed by remaining solids of the dried alignment material.

19. The method as claimed in claim 18, further comprising patterning the sacrificial layer to form a recess part between the first area and the second area, the roof layer extending into the recess part.

* * * * *